United States Patent [19]
Padi

[11] Patent Number: 5,070,308
[45] Date of Patent: Dec. 3, 1991

[54] WORKING POINT ADJUSTING CIRCUIT FOR A POWER AMPLIFIER

[76] Inventor: Gyula Padi, 3808 Nolina Cir., Lancaster, Calif. 93536

[21] Appl. No.: 588,584

[22] Filed: Sep. 25, 1990

[51] Int. Cl.$^5$ .............................................. H03F 3/26
[52] U.S. Cl. .................... 330/268; 330/270; 330/255; 330/262; 330/263
[58] Field of Search ............ 330/268, 255, 262, 263, 330/270, 273, 285, 296, 119

[56] References Cited

U.S. PATENT DOCUMENTS

| | | | |
|---|---|---|---|
| 3,912,981 | 10/1975 | Tsurushima | 317/33 |
| 4,031,482 | 6/1977 | Tsurushima | 330/35 |
| 4,057,764 | 11/1977 | Yokoyama | 330/264 |
| 4,135,162 | 1/1979 | Takahashi | 330/255 |
| 4,160,216 | 7/1979 | Thornton | 330/273 |
| 4,165,494 | 8/1979 | Becker | 330/267 |
| 4,167,708 | 9/1979 | Goto | 330/263 |
| 4,178,559 | 12/1979 | Nichols | 330/296 |
| 4,220,930 | 9/1980 | Ahmed | 330/270 |
| 4,237,425 | 12/1980 | Spiegel | 330/263 |
| 4,342,966 | 8/1982 | Tamura | 330/268 |
| 4,404,528 | 9/1983 | Yamaguchi | 330/288 |
| 4,424,493 | 1/1984 | Schroeder | 330/263 |
| 4,454,479 | 6/1984 | Spires | 330/263 |
| 4,540,951 | 9/1985 | Ozawa | 330/267 |
| 4,719,431 | 1/1988 | Karsten | 330/273 |
| 4,723,111 | 2/1988 | Verhoeven | 330/255 |

Primary Examiner—Eugene R. LaRoche
Assistant Examiner—R. A. Ratliff
Attorney, Agent, or Firm—Thomas I. Rozsa

[57] ABSTRACT

A working point adjusting circuit for a power amplifier. When this simple circuit is connected into a Class B transistor power amplifier it adjusts the working point of the transistors in the output circuit of the power amplifier to the linear portion of the current-voltage characteristics of the transistor so the amplifier works in the level of a Class A amplifier. It provides many significant advantages including (1) much higher energy efficiency on output transistors; (2) much less signal distortion on loaded speakers; (3) simple circuitry for increased reliability; and (4) low component count for reduced costs.

15 Claims, 1 Drawing Sheet

WORKING POINT ADJUSTING CIRCUIT FOR A POWER AMPLIFIER

BACKGROUND OF THE INVENTION

1. Field of the Invention

The present invention relates to electronic circuits. In particular, the present invention relates to power amplifiers.

2. Description of the Prior Art

In general, electronic power amplifier circuits have been produced in the prior art. The following patents are representative of known power amplifier circuits:

1. U.S. Pat. No. 4,719,431 issued to Karsten on Jan. 12, 1988 for "Audio Power Amplifier".
2. U.S. Pat. No. 4,165,494 issued to Becker on Aug. 21, 1979 for "Bi-State Linear Amplifier".
3. U.S. Pat. No. 4,167,708 issued to Goto on Sep. 11, 1979 for "Transistor Amplifier".
4. U.S. Pat. No. 4,135,162 issued to Takahashi on Jan. 16, 1979 for "Power Amplifier Circuits".
5. U.S. Pat. No. 4,424,493 issued to Schroeder on Jan. 3, 1984 for "Cross-Coupled Complementary Power Amplifier".
6. U.S. Pat. No. 4,540,951 issued to Ozawa et al. on Sep. 10, 1985 for "Amplifier Circuit".
7. U.S. Pat. No. 4,404,528 issued to Yamaguchi on Sep. 13, 1983 for "Output Amplifier".
8. U.S. Pat. No. 4,237,425 issued to Spiegel on Dec. 2, 1980 for "Automatic Bias Adjusting Circuit".
9. U.S. Pat. No. 4,220,930 issued to Ahmed on Sep. 2, 1980 for "Quasi-Linear Amplifier With Feedback-controlled Idling Currents".
10. U.S. Pat. No. 4,031,482 issued to Tsurushima on June 21, 1977 for "Bias Circuit For FET".
11. U.S. Pat. No. 4,454,479 issued to Spires on June 12, 1984 for "Operational Amplifier With Improved Output Capability".
12. U.S. Pat. No. 4,342,966 issued to Tamura on Aug. 3, 1982 for "Power Amplifier Circuitry".
13. U.S. Pat. No. 3,912,981 issued to Trurushima on Oct. 14, 1975 for "Protective Circuit For Field Effect Transistor Amplifier".
14. U.S. Pat. No. 4,057,764 issued to Yokoyama on Nov. 8, 1977 for "Amplifier".
15. U.S. Pat. No. 4,178,559 issued to Nichols on Dec. 11, 1979 for "Amplifier Distortion Reduction Apparatus".
16. U.S. Pat. No. 4,723,111 issued to Verhoeven et al. on Feb. 2, 1988 for "Amplifier Arrangement".

U.S. Pat. No. 4,719,431 issued to Karsten discloses a audio power amplifier which comprises a pair of input terminals, a pair of output terminals, a pair of matched output tubes and a pair of output power supplies, and all of which are connected to form a bridge circuit in the power amplifier circuitry. This power amplifier is capable of producing high output power levels over a wide frequency range and uses fairly few components. However it is a double-ended electron tube amplifier.

U.S. Pat. No. 4,165,494 issued to Becker discloses a bi-state linear amplifier which is particularly adapted for use in modern computer data bus systems. This linear amplifier is selectively opened or closed in response to a separate input control signal. It uses diodes in its input and output circuits but the internal opening or closing status of the amplifier is not determined by the diode means, but rather by the separate input control signal.

U.S. Pat. No. 4,167,708 issued to Goto discloses a transistor amplifier which comprises an input stage circuit and an output stage circuit direct coupled to the input stage circuit. The input stage circuit includes the complementary symmetry transistors connected to the constant current circuit. The output stage circuit includes the single-ended complementary symmetry push-pull transistor amplifier. It uses a constant current circuit which comprises the field effect transistor (FET).

U.S. Pat. No. 4,135,162 issued to Takahashi discloses a power amplifier circuit which comprises two input differential amplifier circuits, one connecting complimentary symmetry circuit and two output complementary symmetry push-pull circuits. It uses a diode and a phraseinverting transistor to form a single current mirror circuit between the second differential amplifier circuit and the complimentary symmetry circuit, and a series of diodes in the output complimentary symmetry push-pull circuit to form a biassing circuit. However it uses FET's for first and second differential amplifiers and does not have a diode-transistor circuit to adjust the working point of the transistors.

U.S. Pat. No. 4,424,493 issued to Schroeder discloses a cross-coupled complementary power amplifier circuit which also uses a diode for the biassing circuit but neither has a diode-transistor circuit to adjust the working point of the transistors.

U.S. Pat. No. 4,540,951 issued to Ozawa et al. discloses an amplifier circuit which comprises several circuits including a current mirror circuit and a DC feedback circuit to reduce non-linear distortion in the output signal caused by the base-emitter voltages of the transistors. It uses a circuit to maintain the current constant. However the working point of the transistors in the output circuit is not adjustable.

U.S. Pat. No. 4,404,528 issued to Yamaguchi discloses an output amplifier which has four circuits comprising biasing transistors as well as output amplifying transistors. The attention of the circuit is focused on reducing the output waveform distortions and changes in the idling current corresponding to changes in the bias current.

U.S. Pat. No. 4,237,425 issued to Spiegel discloses an automatic bias adjusting circuit which is a double-ended bias adjusting circuit for a push-pull amplifier and also focused on the bias current stability.

U.S. Pat. No. 4,220,930 issued to Ahmed discloses a quasi-linear amplifier with feedback-controlled idling currents which provides a circuit for establishing the idling currents in the Class AB push-pull output transistor amplifier stages.

U.S. Pat. No. 4,031,482 issued to Tsurushima discloses a bias circuit for FET which provides a circuit for compensating DC bias current changes in the drain of an field effect transistor (FET) caused by power supply fluctuations.

U.S. Pat. No. 4,454,479 issued to Spires discloses an operational amplifier with improved output capability which is focused on providing both maximum output voltage swing and high output current capability.

U.S. Pat. No. 4,342,966 issued to Tamura discloses another power amplifier circuitry which uses two internal batteries in the output stage circuit for passing the base currents of the output transistors to prevent the switching distortion.

U.S. Pat. No. 3,912,981 issued to Trurushima discloses a protective circuit for field effect transistor (FET) amplifier which provides an improved protective circuit for a FET amplifier and is particularly adapted for use with an amplifier using at least one FET for amplifying purpose.

U.S. Pat. No. 4,057,764 issued to Yokoyama discloses an amplifier which is also a FET amplifier.

U.S. Pat. No. 4,178,559 issued to Nichols discloses an amplifier distortion reduction apparatus which uses diodes inserted in series with resistors in the output complimentary symmetry push-pull circuit serving as parallel impedance function elements so enough compensation can be obtained to reduce the distortion through the output amplifier circuit. However it reduces the nonlinearity by means of reducing the nonlinearity components of the output signal but not making the transistors to work at the most linear portion of their current-voltage characteristics to start with.

U.S. Pat. No. 4,723,111 issued to Verhoeven et al. discloses an amplifier arrangement which is a particular configuration for output amplifiers operating in Class AB.

Overall, there are numerous power amplifier circuits. Some of them are for Class AB amplifiers, and some for FET amplifiers. For those circuits of a Class B single-ended complimentary symmetry push-pull transistor audio power amplifier, none of them provide working point adjusting circuit and are instead fixed working point circuits.

Referring to FIG. 1, an example of known power amplifier circuits comprises a first NPN transistor Q1 and a second PNP transistor Q2 in the input stage, a third NPN transistor Q3 and a fourth PNP transistor Q4, where the base of Q1 is connected to first terminal A which is an input terminal and the base of Q2 is connected to second terminal B and where Q1 and Q3, Q2 and Q4 are respectively Darlington connected, a fifth NPN transistor Q5 and a sixth PNP transistor Q6 in the output stage, where Q3 and Q5, Q4 and Q6 are also respectively Darlington connected and where the collectors of Q1, Q3 and Q5 are connected to positive power supply B+ and the collectors of Q2, Q4 and Q6 are connected to negative power supply B−, a first resistor R1 which is connected between A and B+, a second resistor R2 which is connected between B and B−, a third resistor R3 which is connected between the bases of Q3 and Q4, a fourth resistor R4 which is connected between the emitters of Q3 and Q4, a fifth resistor R5 and a sixth resistor R6 which are connected between the respective emitters of Q5 and Q6 and the common third terminal C which is an output terminal, a seventh resistor R7, an eighth variable resistor R8, a ninth resistor R9, where R7, R8 and R9 are connected in series between A and B, a seventh NPN transistor Q7, a tenth resistor R10, where the base, collector and emitter of Q7 are connected to the variable end of R8, terminal A and terminal B through R10, respectively. The input stage differential amplifier circuit comprising Q1, Q2, R1 and R2 to which input signal is applied outputs two opposite phrase signals to the first complimentary circuit comprising Q3, Q4, R3 and R4 which form a current mirror circuit where the signal is converted into in-phase signal, therefore the second complimentary symmetry circuit comprising Q5, Q6, R5 and R6 in the output stage operates as a push-pull amplifier, and the bias circuit comprising R7, R8, R9, R10 and Q7 serves for a constant current means.

However, in this circuit the working point of the transistors can not be adjusted into the linear portion of their current-voltage characteristics so the distortion of the signal output to terminal C can not be eliminated and the energy efficiency of the output transistors is only about 70% and lost energy usually generate significant heat in the circuitry components.

The circuit which is able to adjust the working point of the transistors is important because it can provide much less signal distortion and much more energy efficiency for power amplifiers. In addition it is very economic to have the means of making a Class B power amplifier works at the level of a Class A amplifier by simply using a working point adjusting circuit with only few components in the power amplifier and without the high cost of complicated construction of a Class A amplifier.

SUMMARY OF THE PRESENT INVENTION

The present invention is a working point adjusting circuit for a power amplifier.

It is well known that a single-ended complementary symmetry push-pull transistor audio power amplifier circuit is simple in arrangement, low in cost, less in the distortion, and the operation of which is hardly affected by variations in the ambient temperature and the power source voltages. However, the working point of the transistors used in the circuit is not at the very linear portion of the current-voltage characteristics of the transistors, which means that the signal input/output is somewhat nonlinear. These types of amplifiers are classified as Class B amplifiers.

It has been discovered, according to the present invention, that if the working point of the transistors in a Class B transistor amplifier circuit can be adjusted into the very linear portion of the current-voltage characteristics of the transistor, the energy efficiency of the amplifier can be further improved and the signal distortion can be further reduced, making the amplifier work like a Class A amplifier without the complicated arrangement and high cost of constructing a Class A amplifier.

It has been further discovered, according to the present invention, that the working point of the transistors in a power amplifier circuit can be adjusted into the very linear portion of the current-voltage characteristics of the transistor by the means of adding an internal cross-coupled diode-transistor working point adjusting circuit to the ordinary Class B single-ended complementary symmetry pushpull transistor audio power amplifier circuit.

It has been additionally discovered, according to present invention, that in a power amplifier with the working point adjusting circuit there is almost no energy lost at the output complementary paired transistors, and the components in the circuitry operate at a lower current so it is much cooler.

It is therefore an object of the present invention to provide a working point adjusting circuit for a power amplifier which adjusts the working point of the transistors in the power amplifier circuit into the most linear portion of the current-voltage characteristics of the transistors so that the amplifier outputs much less signal distortion and operates with much higher energy efficiency.

It is a further object of the present invention to provide a very simple and economic means of making an ordinary Class B power amplifier work at the level of a Class A power amplifier.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DETAILED DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principle of the invention. Various changes and modifications obvious to one skilled in the art to which the invention pertains are deemed to be within the spirit, scope and contemplation of the invention as further defined in the appended claims.

Figure 1:
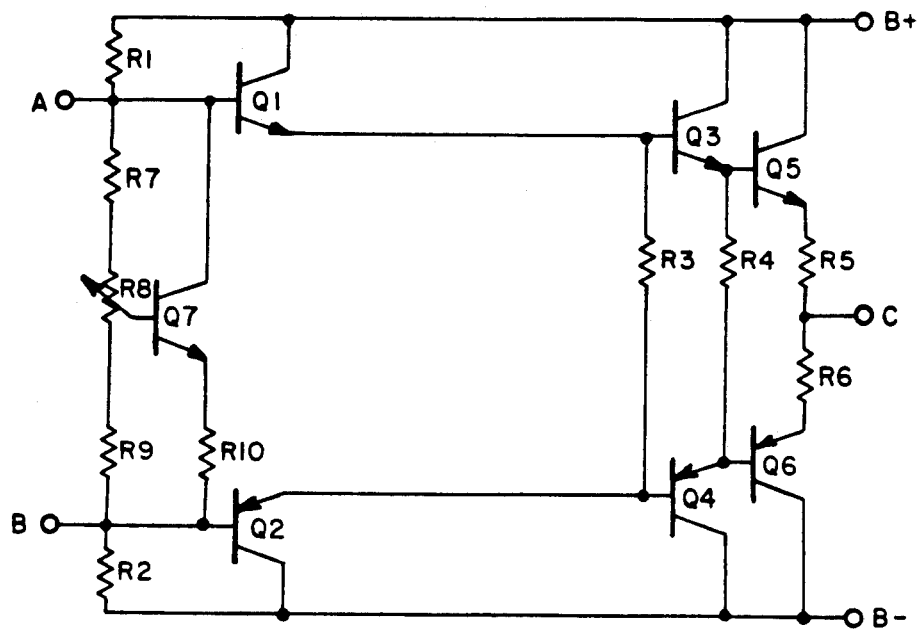
FIG. 1 is a schematic diagram of the circuitry of a known single-ended complimentary symmetry push-pull transistor audio power amplifier.
Figure 2:
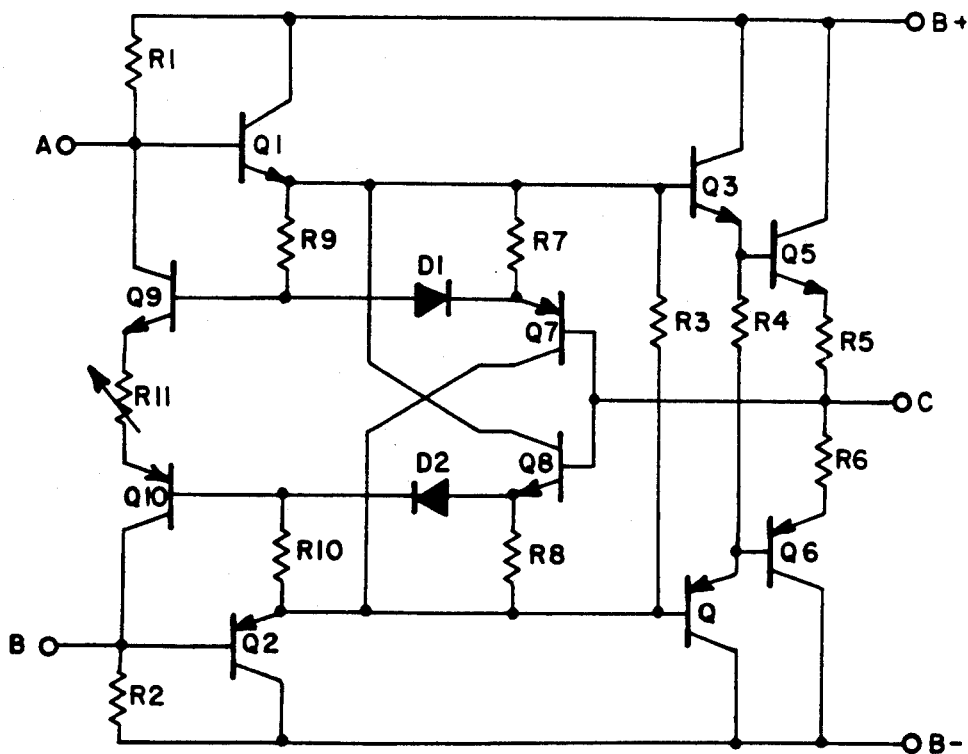
FIG. 2 is a schematic diagram of the circuitry of the preferred embodiment of the present invention.

Referring to FIG. 2, there is shown the schematic diagram of the circuitry of the preferred embodiment of the present invention. A single-ended complimentary symmetry push-pull transistor audio power amplifier with working point adjusting circuit comprises a first NPN transistor Q1 and a second PNP transistor Q2 in the input stage, a third NPN transistor Q3 and a fourth PNP transistor Q4, where the base of Q1 is connected to first terminal A which is an input terminal and the base of Q2 is connected to second terminal B and where Q1 and Q3, Q2 and Q4 are respectively Darlington connected, a fifth NPN transistor Q5 and a sixth PNP transistor Q6 in the output stage, where Q3 and Q5, Q4 and Q6 are also respectively Darlington connected and where the collectors of Q1, Q3 and Q5 are connected to positive power supply B+ and the collectors of Q2, Q4 and Q6 are connected to negative power supply B−, a first resistor R1 which is connected between A and B+, a second resistor R2 which is connected between B and B−, a third resistor R3 which is connected between the bases of Q3 and Q4, a fourth resistor R4 which is connected between the emitters of Q3 and Q4, a fifth resistor R5 and a sixth resistor R6 which are connected between the respective emitters of Q5 and Q6 and the common third terminal C which is an output terminal, where the input stage differential amplifier circuit comprising Q1, Q2, R1 and R2 to which input signal is applied outputs two opposite phase signals to the first complimentary circuit comprising Q3, Q4, R3 and R4 which form a current mirror circuit where the signal is converted into in-phrase signal, therefore the second complimentary symmetry circuit comprising Q5, Q6, R5 and R6 in the out-put stage operates as a push-pull amplifier, and further, in accordance with the present invention, a seventh PNP transistor Q7 and an eighth PNP transistor Q8 which are high input-impedance emitter-followers, where the bases of Q7 and Q8 are connected to terminal C and where the collector of Q7 is connected to the emitter of Q2 and the collector of Q8 is connected to the emitter of Q1, a first diode D1 and a second diode D2 which are rectifier diodes, where the cathode of D1 is connected to the emitter of Q7 and the anode of D2 is connected to the emitter of Q8, a ninth NPN transistor Q9 which is an emitter-follower, where the base and collector of Q9 are connected to the anode of D1 and terminal A respectively, a tenth PNP transistor Q10 which is an emitter-follower, where the base and collector of Q10 are connected to the cathode of D2 and terminal B respectively, a seventh resistor R7 which is a 120 ohm resistor and connected between the emitter of Q1 and the common connecting point of the cathode of D1 and the emitter of Q7, an eighth resistor R8 which is a 120 ohm resistor and connected between the emitter of Q2 and the common connecting point of the anode of D2 and the emitter of Q8, a ninth resistor R9 which is an 8.2 kilo-ohm resistor and connected between the emitter of Q2 and the common connecting point of the cathode of D2 and the base of Q10, and a eleventh variable resistor R11 connected between the emitters of Q9 and Q10, where transistors Q7, Q8, Q9 and Q10, diodes D1 and D2, resistors R7, R8, R9, R10 and variable resistor R11 form a working point adjusting circuit. The signal output to terminal C by the push-pull amplifier in turn feeds back to the bases of transistors Q7 and Q8 which are coupled to each other. When transistor Q8 opens, the current flowing out from the emitter of Q1 will in turn flow through Q8 which causes transistor Q10 to close. Similarly, when transistor Q7 opens, the transistor Q9 closes. The closed transistors Q9 and Q10 in the circuit create a higher voltage between the bases and emitters of the amplifying transistors which causes the working point of the transistors to move to the linear portion of the current-voltage characteristics of the transistor, which is the level of a Class A power amplifier.

The present invention, a working point adjusting circuit for a power amplifier as described above provides many significant advantages, including: (1) much higher energy efficiency on output transistors; (2) much less signal distortion on loaded speakers; (3) simple circuitry for increased reliability; and (4) low component count for reduced costs.

Defined in detail, the present invention is a working point adjusting circuit for a single-ended complimentary symmetry push-pull transistor audio power amplifier. Such a power amplifier having a first NPN transistor and a second PNP transistor in the input stage, a third NPN transistor and a fourth PNP transistor, where the base of the first transistor is connected to a first terminal which is an input terminal and the base of the second transistor is connected to a second terminal and where the first transistor and the third transistor, the second transistor and the fourth transistor are respectively Darlington connected, a fifth NPN transistor and a sixth PNP transistor in the output stage, where the third transistor and the fifth transistor, the fourth transistor and the sixth transistor are also respectively Darlington connected and where the collectors of the first transistor, the third transistor and the fifth transistor are connected to a positive power supply and the collectors of the second transistor, the fourth transistor and the sixth transistor are connected to negative power supply, a first resistor which is connected between the first terminal and the positive power supply, a second resistor which is connected between the second terminal and the negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a third common terminal which is an output terminal, in accordance with present invention, a working point adjusting circuit comprises: (a) a seventh PNP transistor; (b) the base of said seventh transistor connected to said third terminal; (c) the collector of said seventh transistor connected to the emitter of said second transistor; (d) an eighth NPN transistor; (e) the base of said eighth transistor connected to said third terminal; (f) the collector of said eighth transistor connected to the emitter of said first transistor; (g) a first diode; (h) the cathode of said first diode connected to the emitter of said seventh transistor; (i) a ninth NPN transistor; (j) the base of said ninth transistor connected to the anode of said first diode; (k) the collector of said ninth transistor connected to said first terminal; (l) a second diode; (m) the anode of said second diode connected to the emitter of said eighth transistor; (n) a tenth PNP transistor; (o) the base said tenth transistor connected to the cathode of said second diode; (p) the collector of said tenth transistor connected to the said second terminal; (q) a seventh resistor connected between the emitter of said first transistor and the common connecting point of the cathode of said first diode and the emitter of said seventh transistor; (r) an eighth resistor connected between the emitter of said second transistor and the common connecting point of the anode of said second diode and the emitter of said eighth transistor; (s) a ninth resistor connected between the emitter of said first transistor and the common connecting point of the anode of said first diode and the base of said ninth transistor; (t) a tenth resistor connected between the emitter of said second transistor and the common connecting point of the cathode of said second diode and the base of said tenth transistor; (u) an eleventh variable resistor R11 connected between the emitters of said ninth transistor and said tenth transistor; and further, when this working point adjusting circuit is connected to a Class B single-ended complimentary symmetry push-pull transistor audio power amplifier, the working point of said transistors in the output stage of said amplifier is adjusted to the level of a Class A power amplifier.

Defined broadly, the present invention is a working point adjusting circuit for a power amplifier. Such a power amplifier having an input stage amplifier means for input signal from input means, an output stage push-pull transistor power amplifier means for output signal to output means, and a circuit connector means for connection to the power supply means, a working point adjusting circuit comprising: (a) a first transistor means; (b) a second transistor means; (c) a third transistor means; (d) a fourth transistor means; (e) a first diode means; (f) a second diode means; (g) a circuit connector means for connection between said output means and the common connecting point of the bases of said first and second transistor means; (h) said first transistor means connected with said first diode means and resistor means to provide a circuit means which when open makes said third transistor means to be closed; (i) said second transistor means connected with said second diode means and resistor means to provide a circuit means which when open makes said fourth transistor means to be closed; (j) said third and fourth transistor means connected with a variable resistor means in said input stage; (k) a circuit connector means for connection of said working point adjusting circuit to said power amplifier circuit; and further, when this working point adjusting circuit means is connected to a transistor power amplifier, the working point of said transistor means in the output means of said amplifier is adjusted to the level of a Class A power amplifier.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus is intended only for illustration and for disclosure of an operative embodiment and not to show all of the various forms or modification in which the invention might be embodied or operated.

The invention has been described in considerable detail in order to comply with the patent laws by providing full public disclosure of at least one of its forms. However, such detailed description is not intended in any way to limit the broad features or principles of the invention, or the scope of patent monopoly to be granted.

What is claimed is:

1. In a single-ended complimentary symmetry push-pull transistor audio power amplifier having a first NPN transistor and a second PNP transistor in an input stage, a third NPN transistor and a fourth PNP transistor, where the base of the first transistor is connected to a first terminal which is an input terminal and the base of the second transistor is connected to a second terminal and where the first transistor and the third transistor, the second transistor and the fourth transistor are respectively Darlington connected, a fifth NPN transistor and a sixth PNP transistor in the output stage, where the third transistor and the fifth transistor, the fourth transistor and the sixth transistor are also respectively Darlington connected and where the collectors of the first transistor, the third transistor and the fifth transistor are connected to a positive power supply and the collectors of the second transistor, the fourth transistor and the sixth transistor are connected to a negative power supply, a first resistor which is connected between the first terminal and the positive power supply, a second resistor which is connected between the second terminal and the negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a third common terminal which is an output terminal, a working point adjusting circuit comprising:

a. a seventh transistor which is a PNP transistor;
b. the base of said seventh transistor connected to said third terminal;
c. the collector of said seventh transistor connected to the emitter of said second transistor;
d. an eighth transistor which is an NPN transistor;
e. the base of said eighth transistor connected to said third terminal;
f. the collector of said eighth transistor connected to the emitter of s id first transistor;
g. a first diode;
h. the cathode of said first diode connected to the emitter of said seventh transistor;

i. a ninth transistor which is an NPN transistor;
j. the base of said ninth transistor connected to the anode of said first diode;
k. the collector of said ninth transistor connected to said first terminal;
l. a second diode;
m. the anode of said second diode connected to the emitter of said eighth transistor;
n. a tenth transistor which is a PNP transistor;
o. the base said tenth transistor connected to the cathode of said second diode;
p. the collector of said tenth transistor connected to said second terminal;
q. a seventh resistor connected between the emitter of said first transistor and the common connecting point of the cathode of said first diode and the emitter of said seventh transistor;
r. an eighth resistor connected between the emitter of said second transistor and the common connecting point of the anode of said second diode and the emitter of said eighth transistor;
s. a ninth resistor connected between the emitter of said first transistor and the common connecting point of the anode of said first diode and the base of said ninth transistor;
t. a tenth resistor connected between the emitter of said second transistor and the common connecting point of the cathode of said second diode and the base of said tenth transistor; and
u. an eleventh variable resistor R11 connected between the emitters of said ninth transistor and said tenth transistor;

2. A working point adjusting circuit in accordance with claim 1 wherein said seventh transistor and said eighth transistor are high input-impedance emitter-followers.

3. A working point adjusting circuit in accordance with claim 1 wherein said ninth transistor and said tenth transistor are emitter-followers.

4. A working point adjusting circuit in accordance with claim 1 wherein said first diode and second diode are rectifier diodes.

5. A working point adjusting circuit in accordance with claim 1 whereby when said circuit connection means is connected to a Class B single-ended complimentary symmetry push-pull transistor audio power amplifier, the working point of said transistors in the output stage of said amplifier is adjusted to the level of a Class A power amplifier.

6. In a single-ended complimentary symmetry push-pull transistor audio power amplifier having a first NPN transistor and a second PNP transistor in the input stage, a third NPN transistor and a fourth PNP transistor, where the base of the first transistor is connected to a first terminal which is an input terminal and the base of the second transistor is connected to a second terminal and where the first transistor and the third transistor, the second transistor and the fourth transistor are respectively Darlington connected, a fifth NPN transistor and a sixth PNP transistor in the output stage, where the third transistor and the fifth transistor, the fourth transistor and the sixth transistor are also respectively Darlington connected and where the collectors of the first transistor, the third transistor and the fifth transistor are connected to a positive power supply and the collectors of the second transistor, the fourth transistor and the sixth transistor are connected to negative power supply, a first resistor which is connected between the first terminal and a positive power supply, a second resistor which is connected between the second terminal and a negative power supply, a third resistor which is connected between the bases of the third transistor and the fourth transistor, a fourth resistor which is connected between the emitters of the third transistor and the fourth transistor, a fifth resistor and a sixth resistor which are connected between the respective emitters of the fifth transistor and the sixth transistor and a third common terminal which is an output terminal, a working point adjusting circuit comprising:

a. a seventh transistor which is a PNP transistor;
b. the base of said seventh transistor connected to said third terminal;
c. the collector of said seventh transistor connected to the emitter of said second transistor;
d. an eighth transistor which is an NPN transistor;
e. the base of said eighth transistor connected to said third terminal;
f. the collector of said eighth transistor connected to the emitter of said first transistor;
g. a first diode;
h. the cathode of said first diode connected to the emitter of said seventh transistor;
i. a ninth transistor which is an NPN transistor;
j. the base of said ninth transistor connected to the anode of said first diode;
k. the collector of said ninth transistor connected to said first terminal;
l. a second diode;
m. the anode of said second diode connected to the emitter of said eighth transistor;
n. a tenth transistor which is a PNP transistor;
o. the base said tenth transistor connected to the cathode of said second diode;
p. the collector of said tenth transistor connected to said second terminal;
q. a seventh resistor which is a 120 ohm resistor connected between the emitter o said first transistor and the common connecting point of the cathode of said first diode and the emitter of said seventh transistor;
r. an eighth resistor which is a 120 ohm resistor connected between the emitter of said second transistor and the common connecting point of the anode of said second diode and the emitter of said eighth transistor;
s. a ninth resistor which is a 8.2 kilo-ohm resistor connected between the emitter of said first transistor and the common connecting point of the anode of said first diode and the base of said ninth transistor;
t. a tenth resistor which is a 8.2 kilo-ohm resistor connected between the emitter of said second transistor and the common connecting point of the cathode of said second diode and the base of said tenth transistor; and
u. an eleventh variable resistor R11 connected between the emitters of said ninth transistor and said tenth transistor;

7. A working point adjusting circuit in accordance with claim 6 wherein said seventh transistor and said eighth transistor are high input-impedance emitter-follower.

8. A working point adjusting circuit in accordance with claim 6 wherein said ninth transistor and said tenth transistor are emitter-followers.

9. A working point adjusting circuit in accordance with claim 6 wherein said first diode and second diode are rectifier diodes.

10. A working point adjusting circuit in accordance with claim 6 whereby when said circuit connection means is connected to a Class B single-ended complimentary symmetry push-pull transistor audio power amplifier, the working point of said transistors in the output stage of said amplifier is adjusted to the level of a Class A power amplifier.

11. For a power amplifier circuit having an input circuit means including at least one transistor connected to an input terminal, an output push-pull power amplifier circuit means including at least one pair of transistors connected to an output terminal, and means for connecting the input and output circuit means together and to a power supply means, a working point adjusting circuit, comprising,
   a. a pair of switching transistor means and a pair of biasing transistor means, in addition to said at least one transistor means of said input circuit means and said at least one pair of transistors means of said output circuit means of said power amplifier circuit, where the bases of the pair of switching transistor means are connected to said output terminal, and the collectors of the pair of biasing transistor means are connected to said input terminal;
   b. a first diode means connected between the emitter of a respective one of said pair of switching transistor means and the base of a respective one of said pair of biasing transistor means, where the respective one of said pair of switching transistor means and the first diode means act to provide a first switching means, which when open, causes the respective one of said pair of biasing transistor means to be closed;
   c. a second diode means connected between the emitter of another respective one of said pair of switching transistor means and the base of another respective one of said pair of biasing transistor means, where the other respective one of said pair of switching transistor means and the second diode means act to provide a second switching means, which when open, causes the other respective one of said pair of biasing transistor means to be closed;
   d. a variable resistor connected between the emitters of said pair of biasing transistor means; and
   e. circuit connector means for connecting said working point adjusting circuit to said power amplifier circuit.

12. A working point adjusting circuit in accordance with claim 11 wherein said pair of switching transistor means are high input-impedance emitter-follower transistors.

13. A working point adjusting circuit in accordance with claim 11 wherein said pair of biasing transistor means are emitter-follower transistors.

14. A working point adjusting circuit in accordance with claim 1 wherein said first and second diodes are rectifier diodes.

15. A working point adjusting circuit in accordance with claim 11 whereby when said circuit connector means is connected to a Class B power amplifier having an output push-pull power amplifier circuit means including at least one pair of transistors means, the working point of the at least one pair of transistors means of the output circuit means of the Class B power amplifier can be adjusted by the working point adjusting circuit to the level of a Class A power amplifier.

* * * * *